(12) United States Patent
Schmidt et al.

(10) Patent No.: US 10,984,843 B2
(45) Date of Patent: Apr. 20, 2021

(54) RAM MEMORY WITH PRE-CHARGING CIRCUITRY COUPLED TO GLOBAL BIT-LINES AND METHOD FOR REDUCING POWER CONSUMPTION

(71) Applicant: International Business Machines Corporation, Armonk, NY (US)

(72) Inventors: Martin Bernhard Schmidt, Stuttgart (DE); Harry Barowski, Schoenaich (DE); Simon Brandl, Stuttgart (DE); Wolfgang Penth, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/289,973

(22) Filed: Mar. 1, 2019

(65) Prior Publication Data

US 2020/0279593 A1 Sep. 3, 2020

(51) Int. Cl.
*G11C 7/12* (2006.01)
*G11C 11/413* (2006.01)
*G11C 7/10* (2006.01)
*G11C 7/18* (2006.01)

(52) U.S. Cl.
CPC .............. *G11C 7/12* (2013.01); *G11C 7/1063* (2013.01); *G11C 7/18* (2013.01); *G11C 11/413* (2013.01)

(58) Field of Classification Search
CPC ........... G11C 7/12; G11C 7/1063; G11C 7/18; G11C 11/413
See application file for complete search history.

(56) References Cited

U.S. PATENT DOCUMENTS

| | | | | |
|---|---|---|---|---|
| 5,808,944 | A * | 9/1998 | Yoshitake | G11C 29/80 365/200 |
| 7,064,990 | B1 * | 6/2006 | Dawson | G11C 29/848 365/189.02 |
| 8,659,963 | B2 * | 2/2014 | Dengler | G11C 7/12 365/203 |
| 9,019,752 | B1 | 4/2015 | Puckett et al. | |
| 9,372,956 | B1 * | 6/2016 | Fan | G06F 30/398 |
| 9,887,011 | B1 | 2/2018 | Hung | |
| 10,002,661 | B2 | 6/2018 | Fritsch et al. | |
| 2005/0057961 | A1 * | 3/2005 | Ahmad | G11C 29/804 365/154 |
| 2007/0103999 | A1 * | 5/2007 | Kodama | G11C 29/4401 365/200 |
| 2011/0235447 | A1 * | 9/2011 | Hess | G11C 29/846 365/200 |
| 2012/0155188 | A1 * | 6/2012 | Buettner | G11C 7/12 365/189.02 |
| 2014/0301150 | A1 * | 10/2014 | Yoon | G11C 29/789 365/203 |

* cited by examiner

*Primary Examiner* — Mushfique Siddique
(74) *Attorney, Agent, or Firm* — David K. Mattheis; William H. Hartwell; Nicholas L. Cadmus

(57) ABSTRACT

A memory cell arrangement for Random Access Memory (RAM) including one or more RAM cell groups. The RAM cell groups having two or more local bit-lines sharing a Global Bit-Line (GBL), a pre-charging circuit connected to the GBL, a multiplexer connected to multiple GBLs and configured to shift an output of a first GBL from a first bit to a second bit at least in part according to a value of a fuse bit register associated with a second GBL, and at least one pre-charge enabling circuit controlled by a combination of a pre-charge input value applied to all GBLs of the memory cell arrangement and a pre-charge enable signal for the GBL.

9 Claims, 5 Drawing Sheets

RAM MEMORY WITH PRE-CHARGING CIRCUITRY COUPLED TO GLOBAL BIT-LINES AND METHOD FOR REDUCING POWER CONSUMPTION

BACKGROUND

The disclosure relates generally to processor static random-access memory (SRAM) designs for reducing power consumption. The disclosure relates particularly to designs for reducing the power consumption of SRAM associated with read operations.

Power consumption of integrated circuits (ICs) is a significant design consideration as many ICs are used in mobile devices relying upon battery power. Power consumption also tends to increase device temperature. As IC element density increases, element dimensions are reduced and the susceptibility of elements to failure from elevated temperatures increases. Memory related operations are a major consumer of power.

SUMMARY

Aspects of the invention disclose memory structures, systems and methods for reducing the power consumption of RAM cell groups. In one aspect, a memory cell arrangement of a RAM cell group comprises one or more RAM cell groups, and each of the one or more RAM cell groups includes two or more local bit-lines sharing a Global Bit-line (GBL). The memory cell groups also include a pre-charging circuit connected to the GBL, and a pre-charge enabling circuit controlled by a pre-charge enable signal adapted to control the pre-charging circuit and thereby the pre-charging of the GBLs.

DETAILED DESCRIPTION

For System on a Chip (SOC) processors, a large part of the die area of the processor is used by memory. Therefore, SRAM is very optimized for area. Special design rules in terms of element dimensions and spacing, are applied for SRAM cells to reduce the size of a cell as much as possible. The relaxed design rules and the large number of row elements of the SRAM leads to many row failures in the SRAM. To improve yield, redundant rows, selectable in the event of a row failure, are implemented in SRAM arrays. If one cell in a bit row is broken, a redundant row is utilized, and the associated broken row is not written to and not read from. However, the row is still active and toggles for a READ operation thereby consuming electric power.

For SRAMs having a global bit line (GBL) combining several local bit lines, the GBL wire connects the lines which gather the data of the local bit lines. Redundant local and global bit-lines are present to offset for failed rows in the cramped circuitry. One way to implement the control for the redundancy is through the use of a fuse bit register latch. Every GBL in the bit system exhibits one fuse bit register latch that will control the use of the GBLs. The fuse bit register latches store the redundancy information with a thermometer code wherein the content of a failed row will be shifted from the original GBL to a redundant GBL and all other content will be shifted accordingly. The fuse bit register latch content will control the multiplexer which selects the desired GBL.

SRAM READ times may be reduced by pre-charging global bit lines, raising the wire voltage to the processor positive voltage $V_{DD}$, prior to a READ operation. The GBL wire is long and has a correspondingly large capacitance which must be charged by the pre-charging. A READ-0 result from the local device evaluation drops, or pulls, the GBL down to the ground voltage Vss.

For a READ-1, the pre-charged voltage of the GBL is not dropped to the ground state. The local devices will draw current from the local bit line because of leakage from the GBL. The '1'-value is protected by the global bit line keeper which will provide that leakage current.

Speculative execution of branched instructions may result in a READ command for a portion of memory. Resolution of the speculative execution may result in a cancellation of that READ command late in the execution cycle. Arrangements having a common pre-charging circuit will necessarily pre-charge the relevant addresses anyway, also wasting energy.

What is needed is a mechanism to selectively pre-charge only those GBLs which are used and to avoid pre-charging GBLs associated with READ operations from mis-branching which may be cancelled late in the READ operation cycle, as well as GBLs which are unused due to failures.

Figure 1:
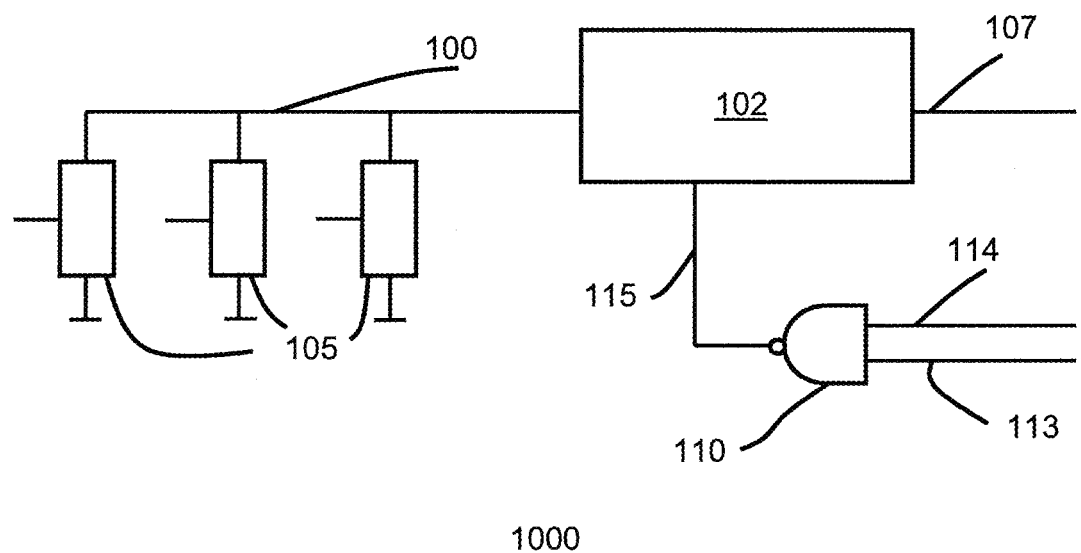
FIG. 1 provides a schematic illustration of a circuit, according to an embodiment of the invention.

FIG. 1 provides an illustration of a memory cell circuit 1000, affording control over the pre-charge circuit 102 for an individual GBL 100. The GBL 100 provides operational access to local bit-lines 105 yielding an output signal on wire 107. As shown in the figure, a pre-charge enabling element 110, comprising a NAND logic gate, controls the pre-charging circuit 102, of the GBL 100. The GBL 100 will be pre-charged when the NAND gate logical output 115, is low, "0", when the two input values 113, and 114 are both high, "1". The pre-charge input value 114 will be high, "1" when the system is attempting to pre-charge the GBL 100. Pre-charging will be enabled when the pre-charge enabling signal 113, is also high, "1". The second NAND input is the pre-charge enabling signal 113, as it determines whether the particular GBL 100, will be pre-charged when a pre-charge input value 114 is applied to all GBLs of the memory cell arrangement.

Redundant global bit-lines may be managed using fuse bit registers and thermometer coding. As an example, a memory cell includes 40 DATA_OUT bits (1-40), and 41 GBLs (0-40). Fuse bit registers and a bit multiplexer control which GBL is associated with a particular DATA_OUT bit. The value of the fuse register changes from "0" to "1" for a GBL which has failed, or which has been shifted due the failure of another GBL. The change shifts the relationship between GBLs and DATA_OUT bits accordingly. A failure of GBL 1 would result in a shift wherein GBL 0 will be used in place of GBL 1 and all other GBLs will remain associated with their respective DATA_OUT bits. A failure of GBL 2 would lead to a shift of each of GBL 0 and GBL 1 to DATA_OUT bits 1 and 2 respectively. All other bits would remain associated with their DATA_OUT bits.

Figure 2:
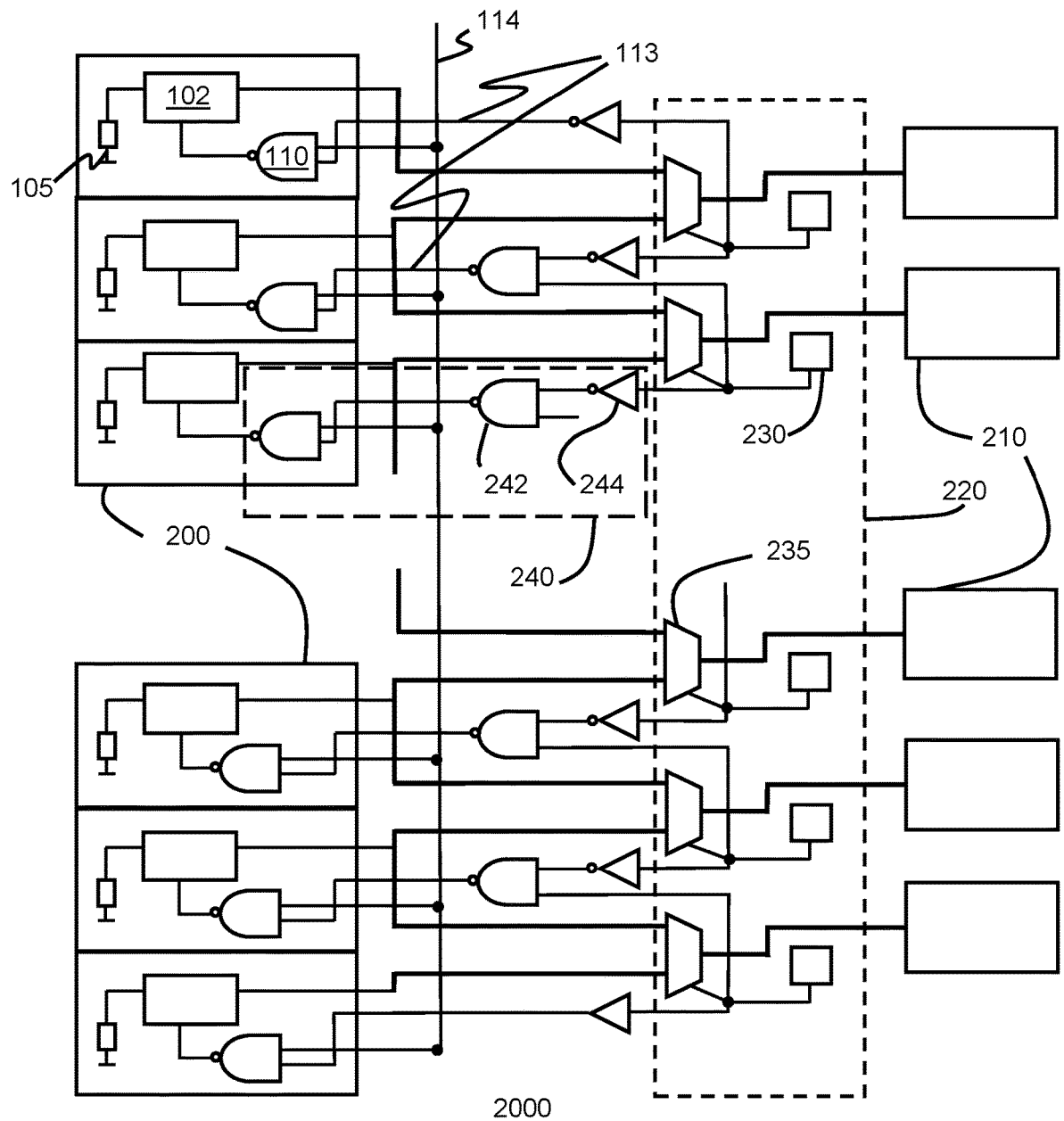
FIG. 2 provides a schematic illustration of a memory cell, according to an embodiment of the invention.

FIG. 2 illustrates an embodiment of the invention. In this embodiment, the standard pre-charge circuit for GBLs is augmented by a multiplexer including a pre-charge enabling circuit. As shown in the figure, a memory cell arrangement 2000 comprises a plurality of GBLs 200, and a corresponding number of DATA_OUT bits 210. The multiplexer 220 is connected to multiple GBLs 200. The multiplexer 220 is adapted to select one of the multiple GBLs 200 for operation at least in part according to the value of a fuse bit register 230. The pre-charge enabling circuitry 240, comprises a NAND gate 242 associated with the fuse bit register values 235, and the fuse bit register value 235 after passing through inverter 244, for a GBL n and GBL n+1 in most instances. For GBL n, N>n>0, the pre-charge enabling signal input to the NAND gate equals NAND (not(fuse(n+1), fuse(n)).

For the first GBL of a cell, GBL 0, the pre-charge enable signal arises from the fuse register bit. The bit value passes directly to the NAND gate. A failed GBL 1, fuse (0)=1, results in a GBL NAND input of "1". In normal operation, the pre-charge signal has a "1" or high value when the GBL is to be pre-charged. The combination of a "1" pre-charge signal and a "1" pre-charge enabling signal results in a NAND output of "0" and the GBL 0 will be pre-charged. If all GBL are error-free, fuse (0)=0 and the GBL NAND output is "1", GBL 0 will not be pre-charged.

For the last GBL of a cell, GBL N, the circuitry is limited to the inverse of the value of the fuse bit value for GBL N, fuse(N). The fuse(N) value toggles the input to a NAND gate for the GBL. A low output from the inverter fuse(N) results in a "1" output from the NAND and no pre-charge of GBL N will occur. A high value from the inverter, corresponding to a fuse(N) value of "0" results in an input to the NAND of "1" and enables the pre-charge.

In an embodiment, once a GBL has failed and redundant GBLs have been substituted, the failed GBLs will no longer be pre-charged due to the pre-charge enabling circuit. GBLs already pre-charged will remain pre-charged, contributing to leakage current, until a READ-0 operation causes the GBLs to drop from the pre-charged state to the ground state. In an embodiment, a READ-0 command may be performed across all RAM addresses periodically to discharge any GBLs which have failed but remain pre-charged. In this embodiment, the READ-0 command may be issued at a system start-up and other convenient times to prevent failed GBLs from remaining pre-charged and contributing to leakage current.

In an embodiment, the pre-charging control circuit may be used to avoid pre-charging portions of the RAM which need not be read. In this embodiment, execution of program instructions may include executing past a branching instruction. The speculative execution may lead to a READ operation for particular addresses in the RAM. As the execution continues, the branching may be resolved such that the READ command is no longer needed. The READ command in this embodiment may execute late in the command cycle enabling the address decoder to signal the pre-charge enabling circuit to disable the pre-charging of the relevant addresses prior to the READ execution. In this embodiment, the addresses of the superfluous READ command may be sent to address decoding circuitry having an output connected to the pre-charge enabling circuitry NAND gate. The address decoding circuitry receives the relevant addresses and generates a low "0" output for the superfluous addresses. The output is passed to the NAND gates resulting in the pre-charge circuit being disabled for the superfluous addresses during the READ command execution conserving energy.

Figure 3:
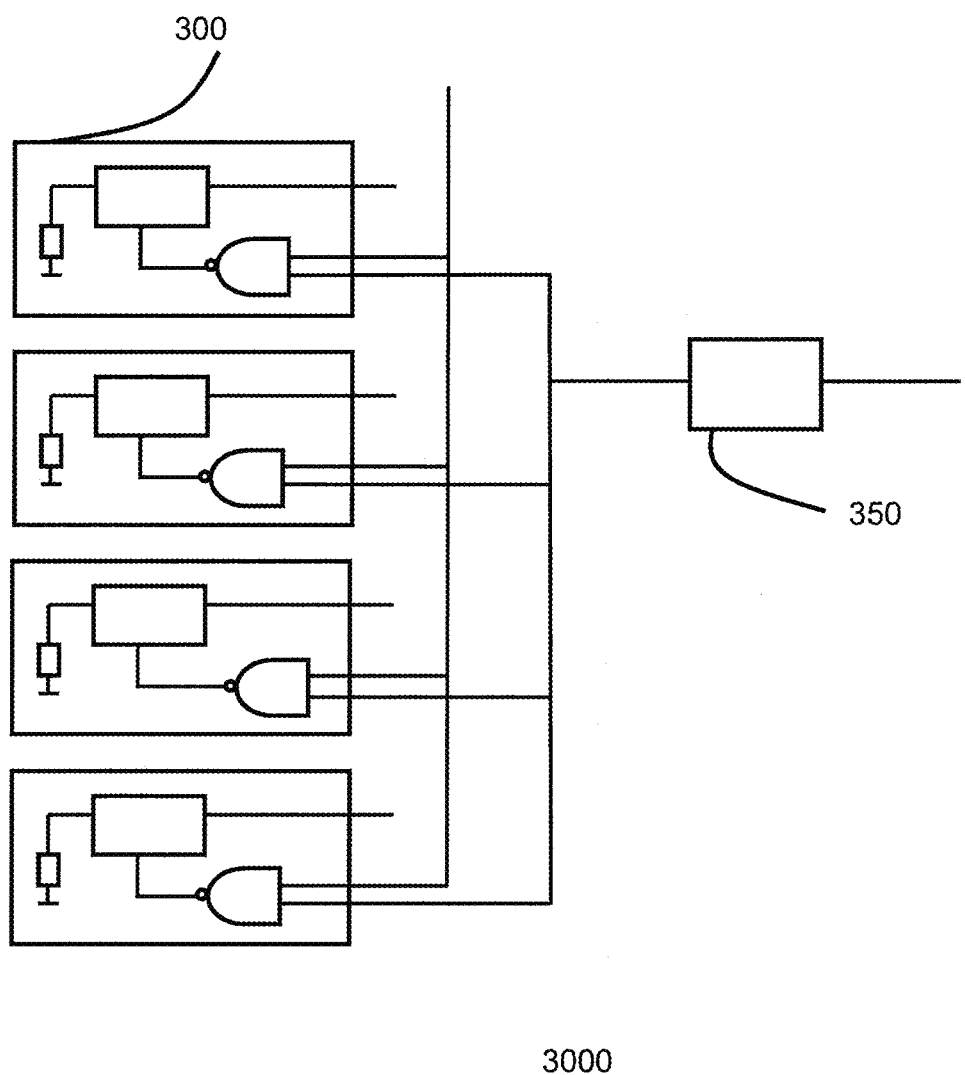
FIG. 3 provides a schematic illustration of a memory cell, according to an embodiment of the invention.

As illustrated in FIG. 3, a memory cell arrangement 3000 comprises a plurality of GBLs 300. Address decoder 350 receives an address input from the system (not shown). The address decoder generates a low "0" output for addresses which will not be read. GBLs receiving a low "0" signal from the decoder will be not be pre-charged.

Each of the fuse bit register and address decoding embodiments may be implemented individually or in combination in memory cell designs. Memory cell arrangements including the embodiments of the invention may be fabricated utilizing integrated circuit fabrication methods as are known in the art.

Figure 4:
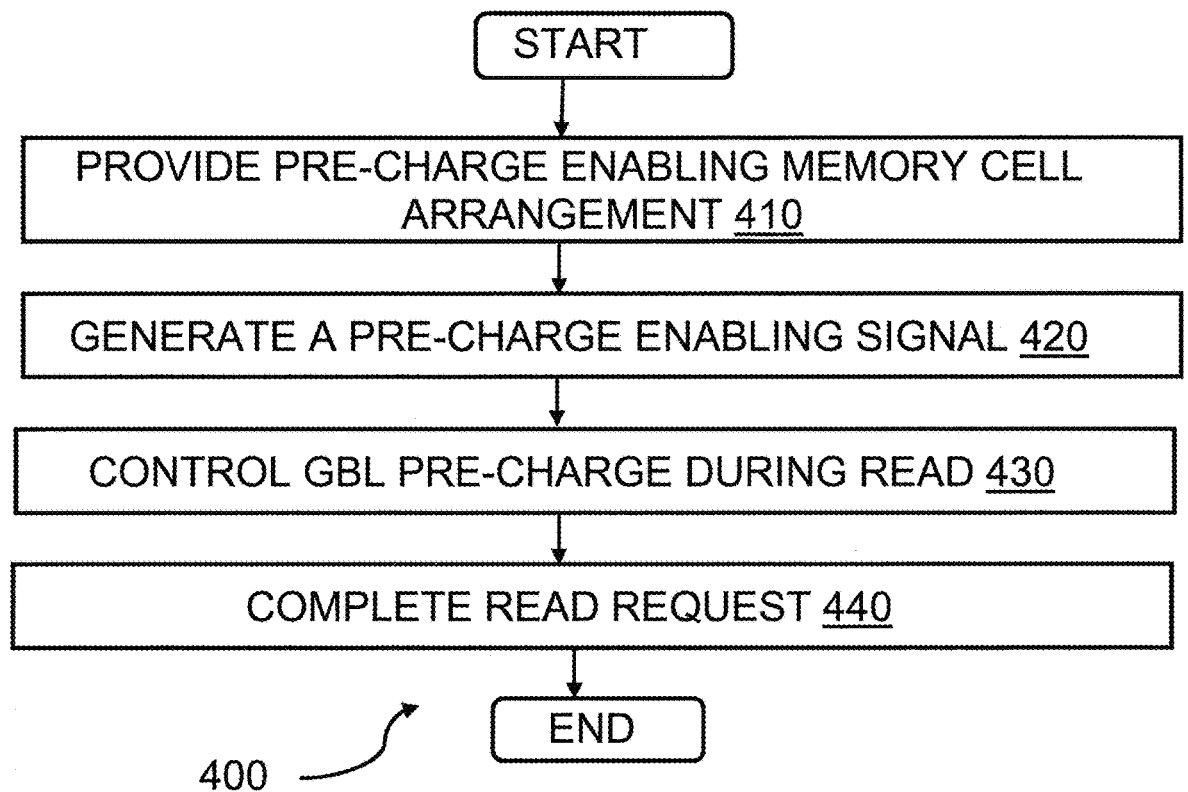
FIG. 4 provides a flowchart depicting an operational sequence, according to an embodiment of the invention.

FIG. 4 provides a flowchart 400, illustrating exemplary activities associated with the practice of the disclosure. As illustrated in the figure, a memory cell arrangement including pre-charge enabling/disabling circuitry is provided at 410. A pre-charge enabling signal is generated to enable or disable pre-charging of relevant GBLs at 420. In an embodiment, the pre-charge enabling signal relates to GBLs which have been replaced with redundant GBLs due to row failures. In an embodiment, the pre-charge enabling signal relates to a late cycle decision to abort reading particular arrays of memory due to resolution of out-of-order branched instruction execution, eliminating any need to read the relevant memory array portions. The signal then controls GBL pre-charging such that only necessary GBLs are pre-charged during the ensuing READ operations at 430. READ operations then proceed without pre-charging the relevant GBLs until the READ operations are completed at 440.

Figure 5:
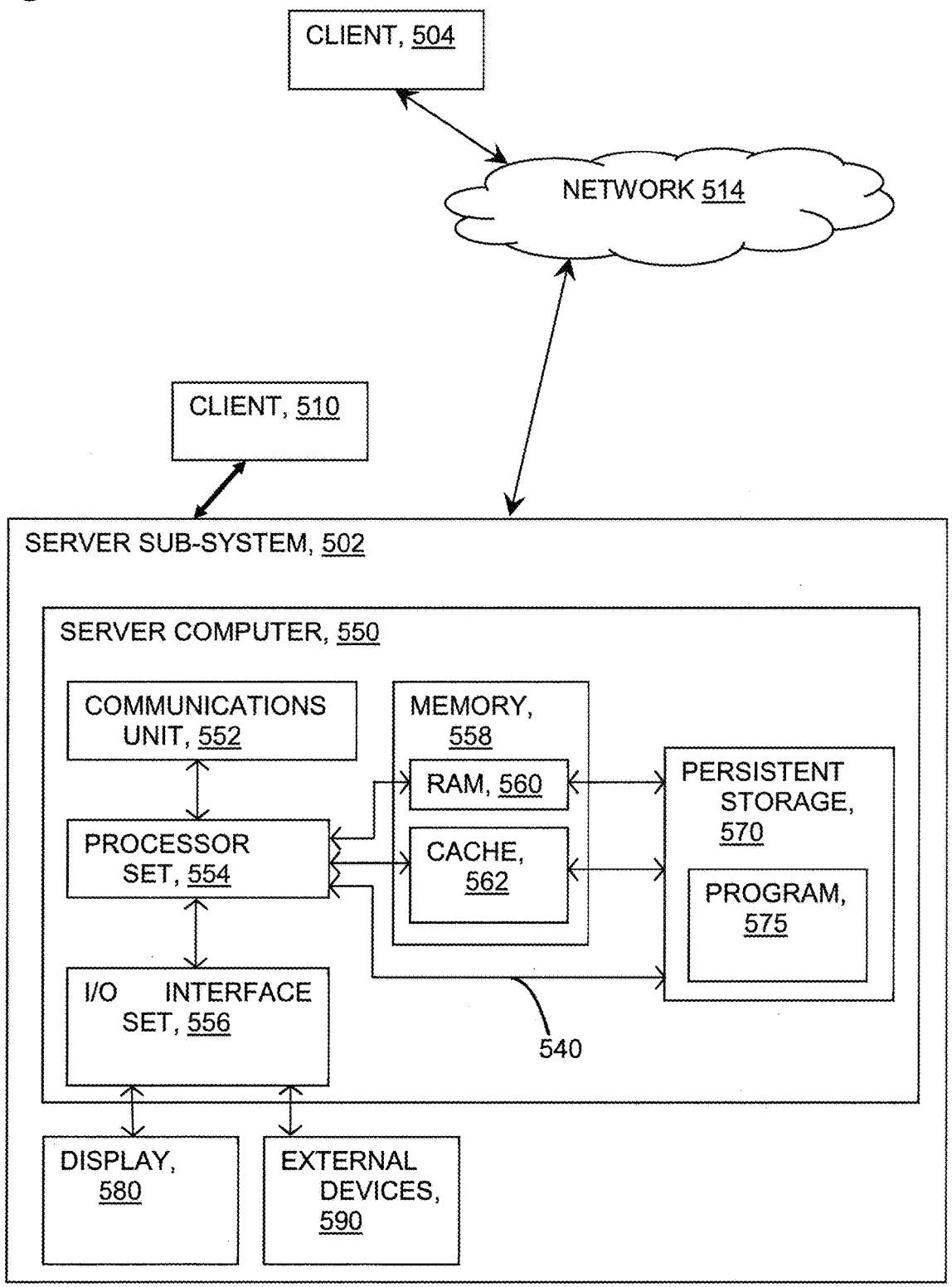
FIG. 5 provides a schematic illustration of networked computer resources adapted, according to an embodiment of the invention.

FIG. 5 provides a schematic illustration of exemplary computer resources associated with practicing the disclosed inventions. The inventions may be practiced in the processors of any of the disclosed elements which process operations. As shown in the figure, a networked Client device 510 connects wirelessly to server sub-system 502. Client device 504 connects wirelessly to server sub-system 502 via network 514. Client devices 504 and 510 comprise operating programs together with sufficient computing resource (processor, memory, network communications hardware) to execute the programs. As shown in FIG. 5, server sub-system 502 comprises a server computer 550. FIG. 5 depicts a block diagram of components of server computer 550 within a networked computer system 5000, in accordance with an embodiment of the present invention. It should be appreciated that FIG. 5 provides only an illustration of one implementation and does not imply any limitations with regard to the environments in which different embodiments can be implemented. Many modifications to the depicted environment can be made.

Server computer 550 can include processor(s) 554, cache 562, memory 558, persistent storage 570, communications unit 552, input/output (I/O) interface(s) 556 and communications fabric 540. Communications fabric 540 provides communications between cache 562, memory 558, persistent storage 570, communications unit 552, and input/output (I/O) interface(s) 556. Communications fabric 540 can be implemented with any architecture designed for passing data and/or control information between processors (such as microprocessors, communications and network processors, etc.), system memory, peripheral devices, and any other hardware components within a system. For example, communications fabric 540 can be implemented with one or more buses.

Memory 558 and persistent storage 570 are computer readable storage media. In this embodiment, memory 558 includes different forms of random-access memory 560 (RAM) such as Static Random-Access Memory (SRAM)

Dynamic Random-Access Memory (DRAM), Ferroelectric RAM (FeRAM), Magneto-resistive RAM (MRAM), Fast Cycle DRAM (FC-RAM), and other know types of RAM. In general, memory 558 can include any suitable volatile or non-volatile computer readable storage media. Cache 562 is a fast memory that enhances the performance of processor(s) 554 by holding recently accessed data, and data near recently accessed data, from memory 558.

Program instructions and data used to practice embodiments of the present invention, e.g., the applications 575, are stored in persistent storage 570 for execution and/or access by one or more of the respective processor(s) 554 of server computer 550 via cache 562. In this embodiment, persistent storage 570 includes a magnetic hard disk drive. Alternatively, or in addition to a magnetic hard disk drive, persistent storage 570 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 570 may also be removable. For example, a removable hard drive may be used for persistent storage 570. Other examples include optical and magnetic disks, thumb drives, and smart cards that are inserted into a drive for transfer onto another computer readable storage medium that is also part of persistent storage 570.

Communications unit 552, in these examples, provides for communications with other data processing systems or devices, including resources of client computing devices 504, and 510. In these examples, communications unit 552 includes one or more network interface cards. Communications unit 552 may provide communications through the use of either or both physical and wireless communications links. Software distribution programs, and other programs and data used for implementation of the present invention, may be downloaded to persistent storage 570 of server computer 550 through communications unit 552.

I/O interface(s) 556 allows for input and output of data with other devices that may be connected to server computer 550. For example, I/O interface(s) 556 may provide a connection to external device(s) 590 such as a keyboard, a keypad, a touch screen, a microphone, a digital camera, and/or some other suitable input device. External device(s) 590 can also include portable computer readable storage media such as, for example, thumb drives, portable optical or magnetic disks, and memory cards. Software and data used to practice embodiments of the present invention, e.g., applications 575 on server computer 550, can be stored on such portable computer readable storage media and can be loaded onto persistent storage 570 via I/O interface(s) 556. I/O interface(s) 556 also connect to a display 580.

Display 580 provides a mechanism to display data to a user and may be, for example, a computer monitor. Display 580 can also function as a touch screen, such as a display of a tablet computer.

The present invention may be a system, a method, and/or a computer program product at any possible technical detail level of integration. The invention may be beneficially practiced in any system, single or parallel, which processes an instruction stream. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A memory cell arrangement for Random Access Memory (RAM) comprising:
   a plurality of RAM cell groups, each RAM cell group comprising:
      a Global Bit-Line (GBL) shared by two or more local bit-lines;
      a pre-charging circuit connected to the GBL;
      a pre-charge enabling circuit comprising a first NAND logic gate, the first NAND logic gate comprising a pre-charge input common to the GBLs of the memory cell arrangement and a pre-charge enabling input for the GBL of the particular RAM cell group, wherein the pre-charge enabling input comprises a second NAND logic gate, wherein inputs of the second NAND logic gate comprise an output from a first fuse bit register storing redundancy information for a first GBL, and an inverted output from a second fuse bit register storing redundancy information for a second GBL; and
   a multiplexer connected to multiple Global Bit-Lines (GBLs) and configured to shift a relationship between GBLs and DATA_OUT bits according to the first fuse bit register and the second fuse bit register.

2. The memory cell arrangement according to claim 1, further comprising address decoding circuitry configured to generate a pre-charge enable signal based on an address provided to the address decoding circuitry.

3. The memory cell arrangement according to claim 1 wherein the RAM cell groups comprise Static Random-Access Memory (SRAM).

4. A computer implemented method for reducing RAM power consumption, the method comprising:
   providing memory cells comprising:
      one or more RAM cell groups comprising:
         a plurality of RAM cell groups, each RAM cell group comprising:
         a Global Bit-Line (GBL) shared by two or more local bit-lines;
         a pre-charge enabling circuit comprising a first NAND logic gate, the first NAND logic gate comprising a pre-charge input common to the GBLs of the memory cell arrangement and a pre-charge enabling input for the GBL of the particular RAM cell group, wherein the pre-charge enabling input comprises a second NAND logic gate, wherein inputs of the second NAND logic gate comprise an output from a first fuse bit register storing redundancy information for a first GBL, and an inverted output from a second fuse bit register storing redundancy information for a second GBL; and
         a multiplexer connected to multiple Global Bit-Lines (GBLs) and configured to shift a relationship between GBLs and DATA_OUT bits according to the first fuse bit register and the second fuse bit register;
   shifting, by the multiplexer, an output of a first GBL from a first bit to a second bit at least in part according to a fuse bit register value associated with a second GBL;
   generating, by one or more computer processors, a pre-charge enabling signal associated with one or more GBLs;
   controlling, by one or more computer processors, the pre-charging circuit of GBLs during a READ operation using the pre-charge enabling circuit according to a combination of the pre-charge enabling signal for the GBL, and the pre-charge input value applied to all GBLs of the RAM cell group.

5. The computer implemented method according to claim 4, further comprising address decoding circuitry configured to generate a pre-charge enable signal based on an address provided to the address decoding circuitry, the method further comprising:
controlling, by one or more computer processors, GBL pre-charge circuitry according to a provided address.

6. The computer implemented method according to claim 4, wherein the RAM cell groups comprise (SRAM).

7. A computer system for managing Random Access Memory (RAM) comprising:
one or more integrated circuits (IC)s, the one or more ICs comprising:
a memory cell arrangement including a plurality of RAM cell groups, each RAM cell group comprising:
a Global Bit-Line (GBL) shared by two or more local bit-lines;
a pre-charging circuit connected to the GBL;
a pre-charge enabling circuit comprising a first NAND logic gate, the first NAND logic gate comprising a pre-charge input common to the GBLs of the memory cell arrangement and a pre-charge enabling input for the GBL of the particular RAM cell group, wherein the pre-charge enabling input comprises a second NAND logic gate, wherein inputs of the second NAND logic gate comprise an output from a first fuse bit register storing redundancy information for a first GBL, and an inverted output from a second fuse bit register storing redundancy information for a second GBL; and
a multiplexer connected to multiple Global Bit-Lines (GBLs) and configured to shift a relationship between GBLs and DATA_OUT bits according to the first fuse bit register and the second fuse bit register.

8. The computer system according to claim 7, wherein the one or more RAM cell groups comprise address decoding circuitry configured to generate a pre-charge enabling signal according to an address provided to the address decoding circuitry.

9. The computer system according to claim 7, wherein the one or more RAM cell groups comprise SRAM.

* * * * *